United States Patent
Park et al.

(10) Patent No.: US 6,509,241 B2
(45) Date of Patent: Jan. 21, 2003

(54) PROCESS FOR FABRICATING AN MOS DEVICE HAVING HIGHLY-LOCALIZED HALO REGIONS

(75) Inventors: Heemyong Park, LaGrangeville, NY (US); Anda C. Mocuta, Wappingers Falls, NY (US); Paul A. Ronsheim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 09/734,754

(22) Filed: Dec. 12, 2000

(65) Prior Publication Data

US 2002/0072176 A1 Jun. 13, 2002

(51) Int. Cl.$^7$ .............................................. H01L 21/336
(52) U.S. Cl. ........................ 438/303; 438/305; 438/307; 257/336
(58) Field of Search ................................ 438/276, 289, 438/299, 305, 306, 307, 429, 440, 444, 525, 527, 546, 549, 555, 556, 303

(56) References Cited

U.S. PATENT DOCUMENTS

| | | | | |
|---|---|---|---|---|
| 4,503,598 A | * | 3/1985 | Vora et al. ................... | 257/341 |
| 5,177,027 A | * | 1/1993 | Lowrey et al. ............. | 257/328 |
| 5,185,280 A | | 2/1993 | Houston et al. ............ | 438/163 |
| 5,543,337 A | | 8/1996 | Yeh et al. .................... | 438/302 |
| 5,554,544 A | | 9/1996 | Hsu ............................ | 438/302 |
| 5,670,392 A | | 9/1997 | Ferla et al. ................. | 438/138 |
| 5,736,440 A | | 4/1998 | Manning .................... | 438/232 |
| 5,849,615 A | | 12/1998 | Ahmad et al. ............. | 438/231 |
| 5,908,313 A | | 6/1999 | Chau et al. ................. | 438/299 |
| 5,936,278 A | * | 8/1999 | Hu et al. ..................... | 257/336 |
| 5,937,293 A | | 8/1999 | Lee ............................. | 438/247 |
| 6,010,936 A | * | 1/2000 | Son ............................. | 438/303 |
| 6,017,798 A | | 1/2000 | Ilderem et al. ............. | 438/286 |
| 6,022,783 A | * | 2/2000 | Wu ............................. | 438/303 |
| 6,051,458 A | | 4/2000 | Liang et al. ................ | 438/224 |
| 6,074,906 A | | 6/2000 | Cheek et al. ............... | 438/231 |
| 6,114,211 A | * | 9/2000 | Fulford et al. .............. | 438/303 |
| 6,153,473 A | * | 11/2000 | Calafut et al. .............. | 438/268 |
| 6,268,640 B1 | * | 7/2001 | Park et al. .................. | 257/607 |
| 6,303,450 B1 | * | 10/2001 | Park et al. .................. | 438/300 |

OTHER PUBLICATIONS

Liou et al., "A 0.8–um CMOS Technology for High Performance ASIC Memory and Channelless Gate Array," IEEE Journal of solid–Gate Circuits, vol. 24, No. 2., 380–387 (1989).

Raynaud et al., "Scalability of Fully Depleted SOI Technology into 0.13 um 1.2 V–1 V CMOS Generation," Institution of Electrical Engineers, IEEE International SOI Conference, 86–87 (1999).

Xu et al., "Impact of Channel Doping and Ar Implant on Device Characteristics of Partially Depleted SOI MOSFETS," IEEE International SOI Conference Proceedings, 115–116 (1998).

* cited by examiner

*Primary Examiner*—Long Pham
*Assistant Examiner*—William David Coleman
(74) *Attorney, Agent, or Firm*—Jay H. Anderson

(57) ABSTRACT

A process for fabricating an MOS device having a highly-localized halo region includes the formation of a first halo region at a first surface of a silicon substrate, and a second halo region at a second surface of the silicon substrate. The second surface of the silicon substrate is formed by anisotropically etching the first surface of the silicon substrate to remove a portion of the material from the substrate. Both the first and second halo regions are formed by low-energy ion implantation. For the fabrication of an n-channel device, boron is implanted at an energy of no more than about 1 keV. Upon implantation and a subsequent annealing process, the first and second halo regions form a continuous halo region within the semiconductor substrate.

19 Claims, 8 Drawing Sheets

PROCESS FOR FABRICATING AN MOS DEVICE HAVING HIGHLY-LOCALIZED HALO REGIONS

FIELD OF THE INVENTION

The present invention relates, generally, to the fabrication of semiconductor devices and, more particularly, to the fabrication of complementary-metal-oxide-semiconductor (CMOS) device structures.

BACKGROUND OF THE INVENTION

Conventional metal-oxide-semiconductor (MOS) transistor fabrication techniques utilize extension regions in the substrate on either side of the channel region below the gate electrode. The extension regions are generally aligned to the gate electrode and are doped at almost the same levels as that of the source/drain regions that are also formed in the substrate on either side of the extension regions. The extension regions function to reduce the electric field gradient in the channel region and minimize hot carrier injection into the gate oxide layer overlying the channel region.

As the gate length of an MOS transistor is reduced to about 0.1 microns or less, the more heavily doped source/drain regions can swamp the extension regions resulting in premature device failure. Attempts to solve the problem by simply increasing the lateral dimensions of the extension regions fail because the device will experience a substantial increase in parasitic resistance, which reduces the transistor drive current. Importantly, a high degree of activation of the extension regions and the doping and the transistor gate electrode are necessary to increase on-state current (Idsat). High resistance within the extension regions can increase the overall series resistance of the device and significantly reduce device saturation current (Idsat). Further, complete activation of dopant atoms in the extension regions requires relatively high-temperature thermal annealing. The high temperature processing causes dopant atoms in the substrate to diffuse, further increasing the series resistance of the device and degrading the rolloff of threshold voltage at short channel lengths.

One means of controlling the threshold voltage is to form a halo region in close proximity to the extension regions. The halo region has the same doping conductivity as that of the substrate in which the device is fabricated. Accordingly, the electrical characteristics of the substrate can be maintained, while increasing the activation levels of the extension regions and source/drain regions. However, the need for high-temperature thermal annealing to activate dopants also causes the halo regions to diffuse reducing their effectiveness.

In addition to the need to maintain a low series resistance in the transistor, many device applications require that the transistor have a stable threshold voltage. In particular, logic devices require that the threshold voltage of CMOS transistors be as constant as possible, regardless of the feature size of the transistors. The integrity of the halo region must be maintained in these devices to avoid changes in the threshold. However, the threshold voltage instability increases if the halo doping regions, individually formed in the vicinity of the source and drain regions, merge together as a result of lateral diffusion as the devices are scaled to smaller gate lengths. This problem can exist even at relatively large gate lengths. Additionally, lateral diffusion of the halo dopants changes the electrical characteristics of the channel region, which can lead to a reduction in the on-state electrical current in the channel region.

Simple geometric tailoring of the halo region doping profile has proven ineffective in the fabrication of MOS transistors having gate lengths on the order of 0.1 microns. The problem is particularly acute in the fabrication of N-channel devices that require boron implantation to fabricate the halo regions. Boron implantation is particularly problematic because boron has a relatively high penetration range (Rp) in silicon. Additionally, boron rapidly diffuses in a lateral direction once implanted into a silicon substrate. The lateral range, or straggle, of implanted boron makes the fabrication of precisely-configured boron profiles difficult. It is known that the lateral straggle of boron atoms can be reduced by reducing the implantation energy. However, for proper electrical performance, the boron halo region must be formed at relatively large depths within the silicon substrate. While it is desirable to have the reduced lateral straggle at low implantation energies, the halo regions must be deep enough to surround the extension regions within the substrate. Accordingly, advanced fabrication technology is necessary for the fabrication of high-functional MOS transistors having gate lengths on the order of about 0.1 micron and less.

BRIEF SUMMARY

The present invention is for a process for fabricating an MOS device having a highly-localized halo region. The process includes providing a semiconductor substrate having a first surface and a gate electrode structure disposed on the first surface. A first halo region is formed at the first surface adjacent to the gate electrode structure. A portion of the first surface is then removed to form a second surface and a second halo region is formed at the second surface. The first and second halo regions are formed, such that the first halo region is continuous with the second halo region.

In a more particular aspect of the invention, the first and second halo regions are formed by ion implantation of boron at an implant energy of no more than about 1 keV. In a non-limiting further aspect of the invention, the second halo region can be formed by implantation of boron at an angle of incidence that is offset with respect to the normal of the second surface.

In a more detailed aspect of the invention, the formation of the second surface is carried out by anisotropically etching the first surface, such that a wall surface is formed in the semiconductor substrate that connects the first surface and the second surface and that is substantially perpendicular to the first and second surfaces. The dimension of the wall surface can be adjusted depending upon the particular design characteristics of the MOS transistor being fabricated. Depending upon the length of the wall surface, the angled ion implantation of boron form the second halo region in conjunction with the formation of the second surface to ensure a uniform boron doping profile in the second halo region. The process can further include the formation of raised source/drain regions at the second surface.

In yet another aspect of the invention, processing is carried out to form a dielectric layer having a high dielectric constant or permittivity ("high-k dielectric") that functions as a gate dielectric layer and a MOS transistor. In the fabrication sequence, the originally-formed gate material is removed after completion of thermal activation annealing. Then, the high-capacitance dielectric material is formed and a second gate material is formed overlying the high-k dielectric material.

In yet another aspect of the invention, disposable sidewall spacers can be used to fabricate the source/drain regions, prior to the formation of the halo regions and other transistor components, such as the extension regions and the source/drain regions.

It will be appreciated that, for clarity of illustration, elements shown in the Figures are not necessarily drawn to scale. For example, the dimensions of the elements are exaggerated relative to each other for clarity. Further, when considered appropriate, reference numerals are repeated amongst the Figures to indicate corresponding elements.

Figure 1:
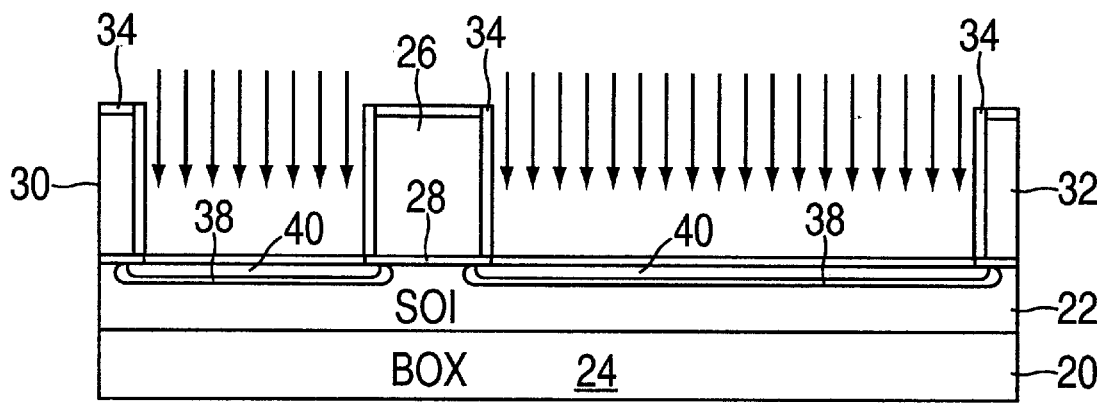
FIGS. 1–6 illustrate, in cross-section, processing steps in accordance with one embodiment of the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Shown in FIG. 1 in cross-section, is a portion of a semiconductor substrate 20 having already undergone several steps in accordance with the invention. Preferably, substrate 20 is a silicon-on-insulator (SOI) substrate that includes a thin semiconductor film 22 overlying and insulating region 24. A gate electrode 26 overlies a portion of thin-film 22 and is separated therefrom by a gate dielectric layer 28. To fully illustrate the dimensional aspects of the invention, portions of nearby gate electrodes 30 and 32 are also shown. Gate electrodes 26, 30, and 32 also include an encapsulating dielectric layer 34 overlying the sidewalls and the upper surfaces of the gate electrodes. An oxide layer 34 overlies a first surface 36 of thin-film 22. Preferably, oxide layer 34 has a thickness of about 10 to about 70 angstroms.

Preferably, gate electrode 26, 30 and 32 are composed of polycrystalline silicon. Alternatively, the gate electrodes can be formed from another semiconductive material, such as a refractory metal silicide, and the like. Also, gate electrodes 26, 30 and 32 can be a metal, such as a refractory metal, aluminum, and aluminum alloy, copper, a copper aluminum alloy, and the like.

After fabricating gate electrodes 26, 30 and 34, first halo regions 38 are formed in thin-film 22. Preferably, first halo of region 38 are formed by ion implantation using gate electrodes 26, 30, and 32 as an implant mask. Those skilled in the art will appreciate that the conductivity of the particular doping used to form halo regions 38 will depend upon the conductivity of the transistor under fabrication. For example, where an n-channel transistor is fabricated, first halo region 38 is preferably formed by ion implantation of boron. Correspondingly, where a p-channel transistor is being fabricated, first halo region 38 is preferably formed by the ion implantation of arsenic. In accordance with the invention, for the fabrication of an n-channel device, the ion implantation of boron is carried out at an implant energy of no more than about 1 keV. Correspondingly, for a p-channel device, the ion implantation of arsenic is carried out at an energy of no more than about 5 keV. As will be subsequently described, the fabrication of halo regions in accordance with the present invention is carried out using low energy ion implantation in order to obtain a significant reduction in lateral spreading of the halo region within thin-film 22.

Preferably, the fabrication of an n-type device, regions 38 are formed by ion implantation of boron, a dose of about $1 \times 10^{13}$ to about $5 \times 10^{14}$ cm$^{-2}$. Correspondingly, for the fabrication of a p-channel device, first halo region 38 is formed by the ion implantation of arsenic with a dose of about $1 \times 10^{13}$ to about $5 \times 10^{14}$ cm$^{-2}$.

After forming first halo region 38, extension regions 40 are formed in thin-film 22. As illustrated in FIG. 1, first halo regions 38 are bounded by extension regions 40. Preferably, for the fabrication of an n-channel device, extension regions 40 are formed by the ion implantation of arsenic at an energy of about 5 keV and a dose of about $5 \times 10^{14}$ to about $5 \times 10^{15}$ cm$^{-2}$. Correspondingly, for the fabrication of a p-channel device, extension regions 40 are preferably formed by the ion implantation of boron difluoride ($BF_2$). In accordance with the invention, the ion implantation steps are carried out, such that extension regions 40 completely engulf and bound first halo regions 38. Further, the implant energies are selected, such that first halo region 38 and extension regions 40 substantially reside at first surface 36 of thin-film 32.

Figure 2:
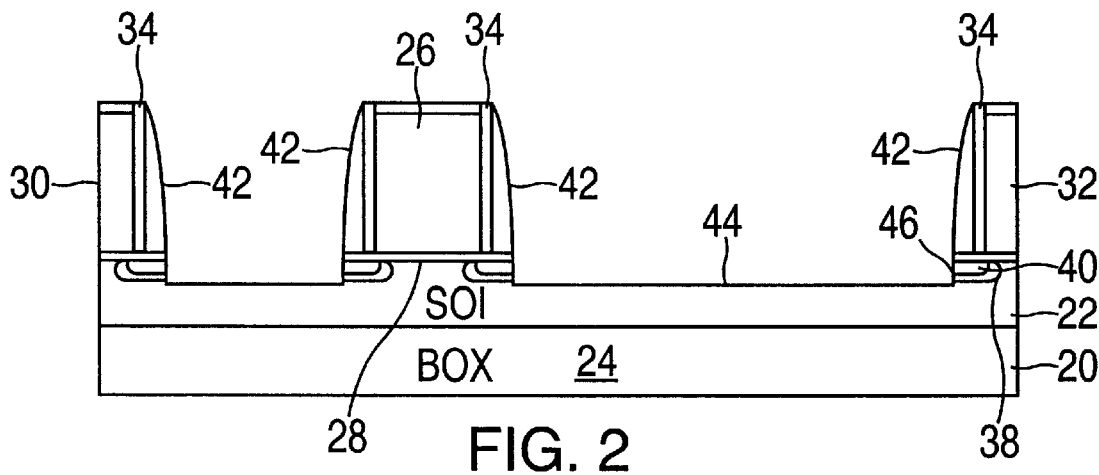

After forming first halo regions 38 and extension regions 40, a sidewall spacer 42 is formed adjacent to the sidewalls of gate electrodes 26, 30 and 34, as illustrated in FIG. 2. Preferably, sidewall spacers 42 are conventionally fabricated by depositing a layer of silicon oxide and anisotropically etching the deposited silicon oxide layer. Then, a portion of oxide layer 34 is etched away and a portion of thin-film 22 is also etched, using sidewall spacers 42 as an etching mask. The etching process forms recess regions within thin-film 22 that are defined by a second surface 44 and sidewalls surface regions 46. Importantly, portions of first halo region 38 and extension regions 40 remain at the portions of first surface 36 that are protected from the etch by sidewall spacers 42 and edge portions of gate electrodes 26, 30, and 32.

Preferably, the etching process is carried out by a reactive-ion-etching (RIE) process to remove from about 20 to about 60 nanometers of material from thin-film 22. The RIE etching process semiconductor material from thin-film 22 in a vertical direction many times faster than in a horizontal direction. Accordingly, sidewall regions 46 are substantially vertical with respect to a major lateral axis of semiconductor substrate 20.

In accordance with the invention, the amount of material removed from thin-film 22 will depend upon the junction depth of extension regions 40. In a preferred embodiment of the invention, the RIE etching process is carried out to remove surface portions of thin-film layer 22, such that second surface 44 is nearly continuous with the junction of extension regions 40.

Figure 3:
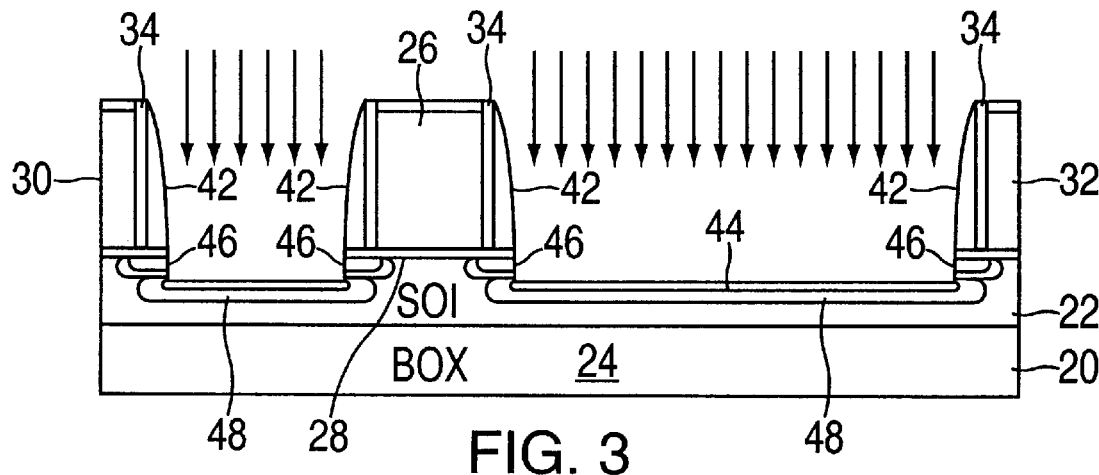

After forming first surface 44, a preamorphization implant is carried out to prepare first surface 44 for a subsequent selective epitaxy deposition process. Preferably, the preamorphization step is carried out by the ion implantation of germanium at a dose of about $1\times10^{14}$ $cm^{-2}$ to about $5\times10^{15}$ $cm^{-2}$. As illustrated in FIG. 3, sidewall spacers 44 are again used as a doping mask for the preamorphization implant.

In accordance with the invention, a second halo region 48 is formed in thin-film 22 at second surface 44. Preferably, for the fabrication of an n-channel device, second halo regions 48 are formed by the ion implantation of either boron or $BF_2$ at an energy of no more than about 2 keV. Preferably, boron is implanted using a dose of about $1\times10^{13}$ to about $5\times10^{14}$ $cm^{-2}$, and $BF_2$ is implanted at a dose of about $1\times10^{13}$ to about $5\times10^{14}$ $cm^{-2}$. Where a p-channel device is fabricated, second halo regions 48 is preferably formed by the ion implantation of phosphorous or arsenic had an energy of no more than about 5 keV and a dose of about $1\times10^{13}$ to about $5\times10^{14}$ $cm^{-2}$. The ion implantation process is preferably carried out using sidewall spacers 42 as a doping mask. In one embodiment of the invention, the ion implantation process is carried out using a minimal offset angle of incidence with respect to the major lateral axis of semiconductor substrate 20. Alternatively, where a relatively large amount of material was removed during the RIE etching process to form second surface 44, an angled ion implantation process can be carried out, in which the angle of incidence is varied during the ion implantation process by the rotation of semiconductor substrate 20 in an ion being at an angle offset from the incidence beam.

Upon completion of the ion implant process, and further aided by a subsequent annealing process, second halo region 48 is substantially continuous with first halo region 38. By ensuring a relatively high doping concentration in second halo region 48 near the periphery of the gate electrodes, stable threshold voltages can be obtained in the transistors under fabrication.

Figure 4:
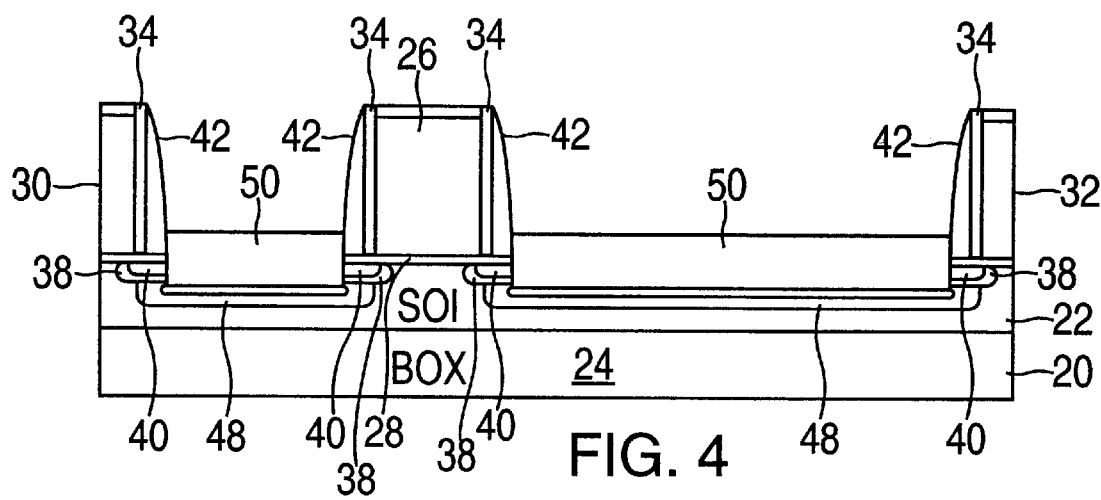

The inventive process continues with the fabrication of elevated source/drain regions 50, as illustrated in FIG. 4. Preferably, a selective epitaxy process is carried out to form elevated source/drain regions 50 to a thickness large enough to avoid silicide formation and contact resistance problems using conventional fabrication procedures. Elevated source/drain regions 50 can be formed by the epitaxial formation of silicon, or alternatively, silicon germanium (SiGe). Preferably, the selective epitaxy process is carried out at a temperature of no more than about 550° C. By maintaining the temperature of the selective epitaxy process at a relatively low value, extensive diffusion of the dopants within first and second halo regions 38 and 48 and extension regions 40 can be avoided.

Figure 5:
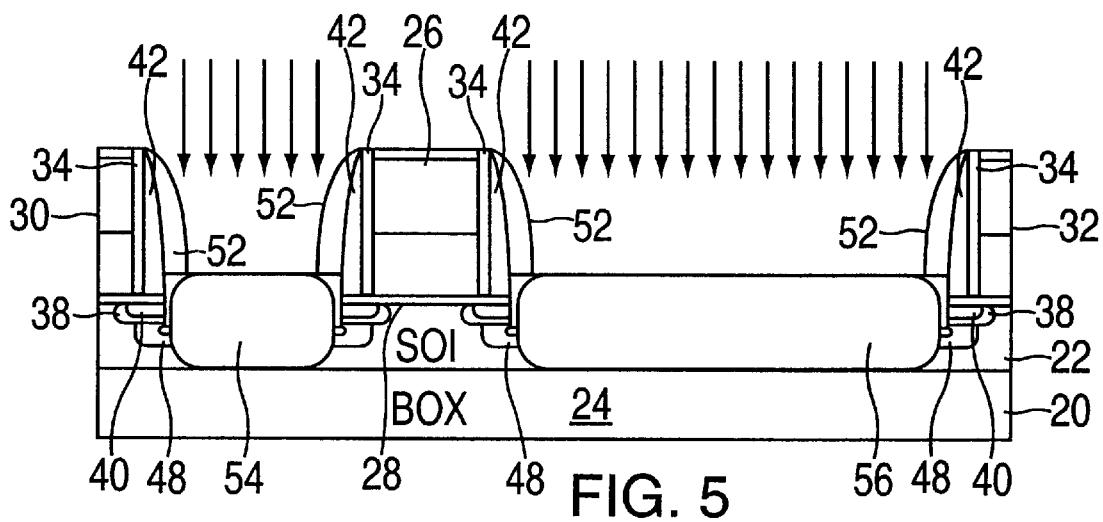

After forming source/drain regions 50, as illustrated in FIG. 5, a second sidewall spacer 52 is formed adjacent to sidewall spacers 42 on gate electrodes 26, 30 and 32. Then, a doping process is carried out to impart a desired level of electrical conductivity in the elevated source/drain regions and in portions of thin-film 22 residing below source/drain regions 50. The doping process is carried out using second sidewall spacers 52 as a doping mask. For the fabrication of an n-channel device, an n-type dopant, such as phosphorous or arsenic is implanted using a dose of about $3\times10^{15}$ to about $2\times10^{16}$ $cm^{-2}$. Correspondingly, for the fabrication of a P-channel device, boron or $BF_2$ is implanted using a dose of about $3\times10^{15}$ to about $1\times10^{16}$ $cm^{-2}$. The implantation energy is selected, such that doped regions 54 and 56 are formed to extend from the upper surface of source/drain regions 50 to the interface between thin-film 22 and insulating region 24.

Figure 6:
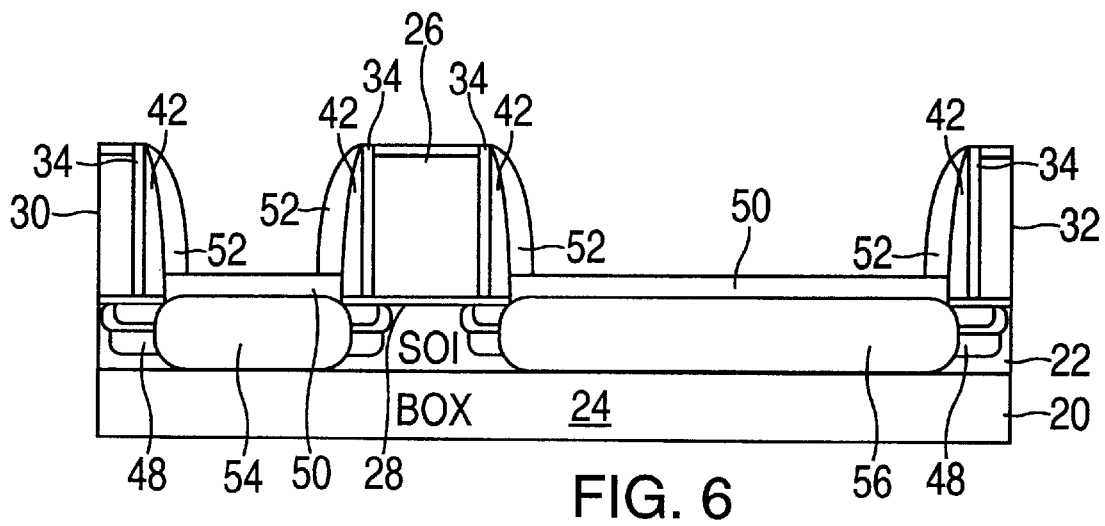

To electrically activate the dopants previously introduced in thin-film 22, an annealing process is carried out at a temperature of about 900 C. to about 1100 C. Importantly, the process of the invention avoids the application of annealing processes until relatively late in the overall process sequence used to fabricate transistor devices. As a result of the delayed annealing, the thermal budget determined by the designed dimensions of the device is not prematurely exhausted. As illustrated in FIG. 6, the annealing process diffuses the doped regions 54 and 56 into thin-film 22. The delayed annealing feature of the present invention enables relatively precise doping profiles to be formed and maintained within thin-film 22. Accordingly, devices having exceedingly small feature sizes can be readily fabricated using the inventive process. In a preferred embodiment of the invention, the annealing process is carried out by rapid thermal annealing (RTA).

Those skilled in the art will appreciate that upon completion of the annealing process, all previously introduced dopants are electrically active and the main functional features of an MOS transistor are provided. Conventional subsequent processing steps can be carried out to form additional structures, such as multi-level metallization for electrical interconnect, and the like.

Figure 7:
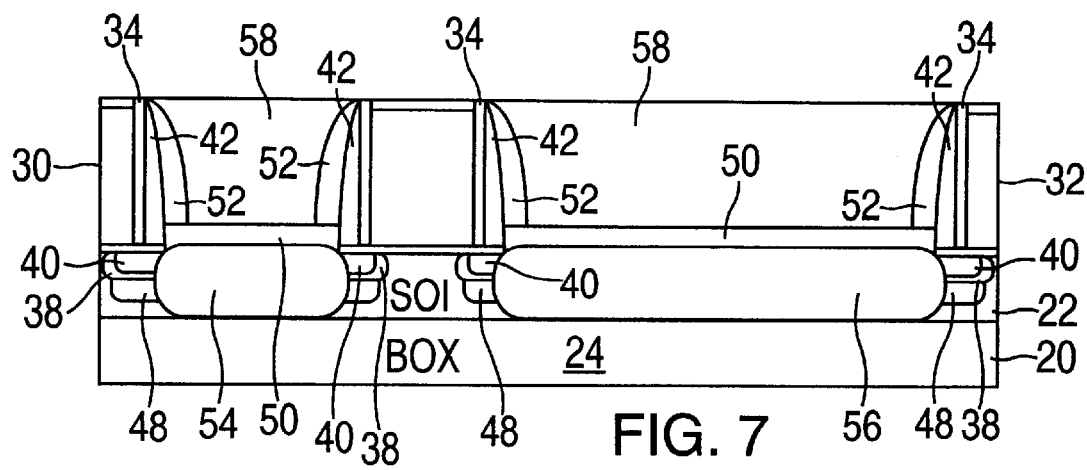
FIGS. 7–10 illustrate, in cross-section, processing steps in accordance with an alternative embodiment of the invention that includes a high-capacitance dielectric layer.

In accordance with another embodiment of the invention, high-k dielectric materials can be used in the inventive process. Where high-k dielectric materials are used, the thermal processing steps used in the fabrication process must be minimized. Additionally, the material and processing used to fabricate gate electrodes 26, 30, and 32 may require the use of a removable gate material. Shown in FIGS. 7–10 is a processing sequence in accordance with an alternative embodiment of the invention incorporating high-k dielectric materials. As shown in FIG. 7, after introducing dopants into thin-film 22 and after carrying out an annealing step to activate the dopants, an oxide layer 58 is formed to overly source/drain regions 50. Preferably, oxide layer 58 is formed by plasma-enhanced-chemical-vapor-deposition (PECVD) at a low temperature followed by chemical-mechanical-polishing (CMP).

Figure 8:
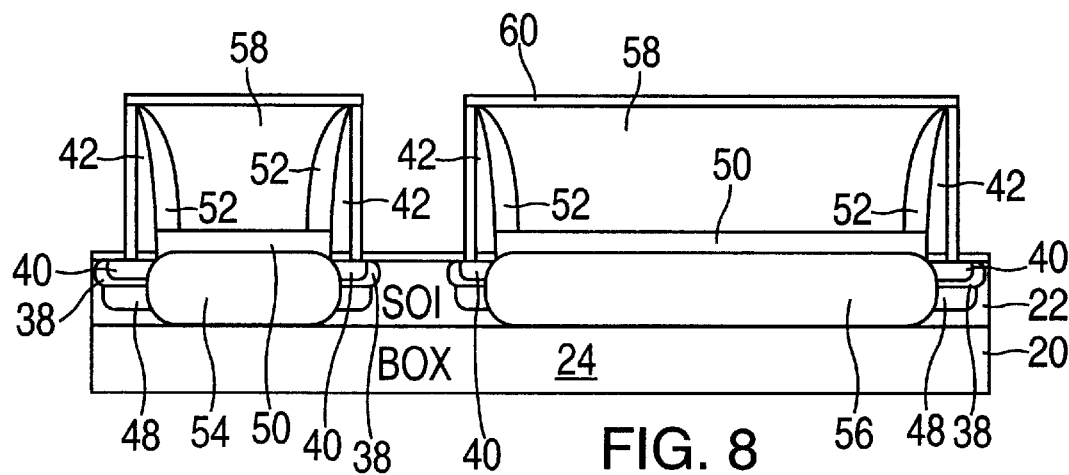

As shown in FIG. 8, following the formation of oxide regions 58, the gate material of gate electrodes 26, 30, and 32 is removed. Preferably, the gate material is removed by isotropically etching away the material using either a wetchemical etch or a nondirectional plasma etch. After removing all dielectric materials overlying the surface of thin-film 22 in the channel regions of the MOS devices, a high-k dielectric layer 60 is formed to overlie first surface 36 of thin-film 22, which correspond to the channel regions of the MOS devices. Preferably, $HfO_2$, $ZrO_2$, or $Al_2O_3$ is deposited onto first surface 36 of thin-film 22 to form high-capacitance dielectric layer 60.

Figure 9:
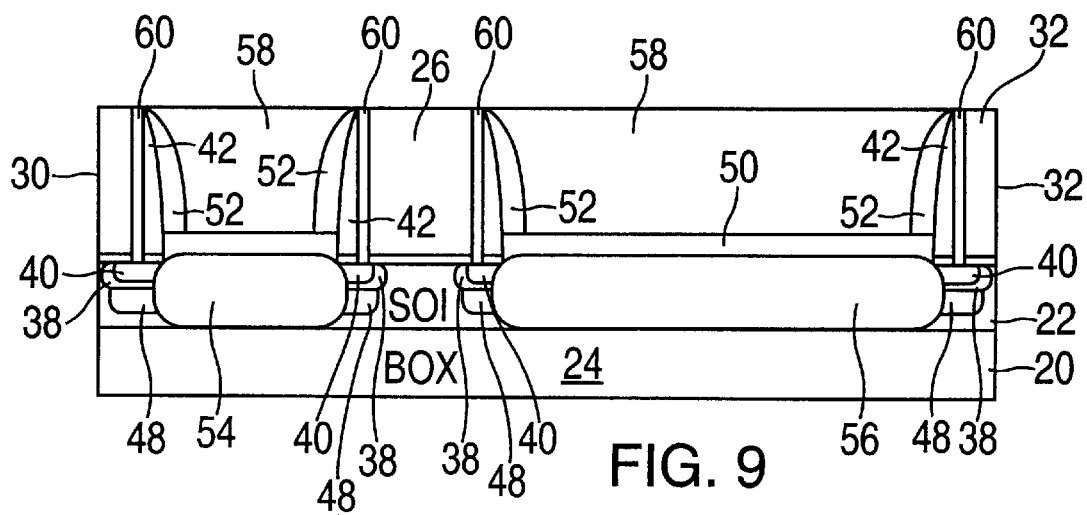

Next, as illustrated in FIG. 9, gate electrodes 26, 30, and 32 are reformed by the deposition of another gate material, such as a metal. Following the deposition, a CMP process is carried out to complete the reformation of the gate electrodes by forming a planar surface.

Figure 10:
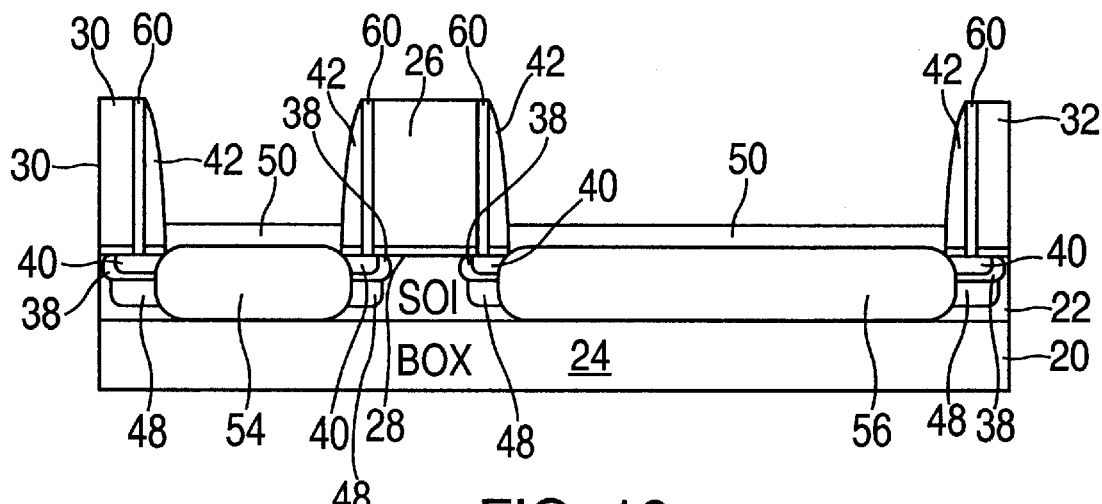

Once the gate electrodes are reformed, oxide layer 58 and second sidewall spacers 52 are removed, as shown in FIG. 10. Preferably, in order that oxide layer 58 and second sidewall spacers 52 be differentially etchable with respect to sidewall spacers 42, sidewall spacers 42 are preferably formed with a nitride material, such as silicon nitride, silicon oxynitride, and the like. If desired, an optional low-temperature spacer formation process can be carried out to form an additional sidewall spacer adjacent to sidewall spacers 42. Regardless of whether or not an additional sidewall spacer is formed, as previously described, conventional processing steps are subsequently carried out to form electrical interconnects, and the like.

Figure 11:
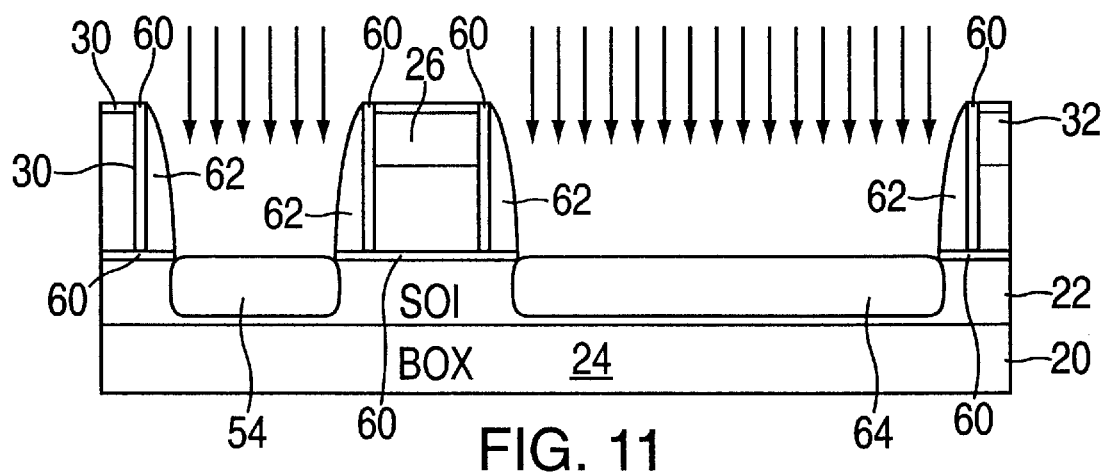
FIG. 11 illustrates, in cross-section, a processing step in accordance with yet another embodiment of the invention that utilizes disposable sidewalls spacers in the fabrication sequence.

In yet another embodiment of the invention, the inventive process can be carried out using disposable sidewall spacers. As illustrated in FIG. 11, after forming disposable sidewall spacers 62 adjacent to gate electrodes 26, 30, and 32, a doping process is carried out to form deep source/drain regions 64 and 66 in thin-film 22. After forming deep source/drain regions 64 and 66, an annealing process is carried out to activate the implanted doping atoms. Thereafter, disposable sidewall spacers 62 are removed and processing continuous as illustrated in FIGS. 1–6.

Using the foregoing description it is believed that one skilled in the art can fully practice the invention. Accordingly, the following example is intended to illustrate various aspects of the invention and is not intended to limit the invention in any way whatsoever.

EXAMPLE

Figure 12:
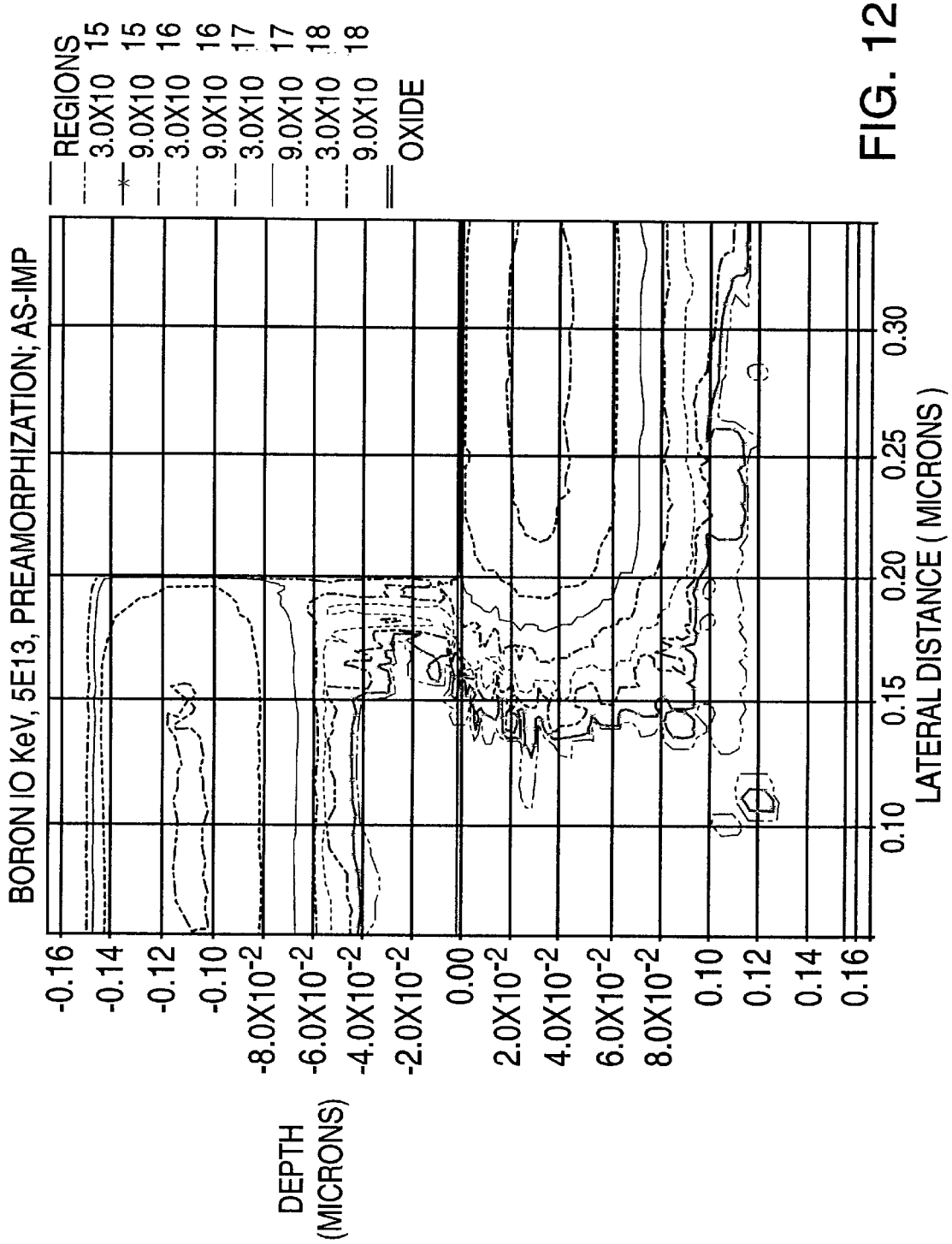
FIG. 12 is a plot illustrating lateral straggle of boron at an ion implantation energy of 10 keV.

A series of Monte Carlo simulation studies were carried out to illustrate the lateral spread of boron implanted into a silicon substrate. FIG. 12 illustrates the results of the Monte Carlo simulation for ion implantation of boron at a dose of $5 \times 10^{13}$ cm$^{-2}$ at 10 keV into a silicon substrate. The Monte Carlo simulations were carried out using a process simulator UT-MARLOWE (Rel. April, 1999). The simulation shows that the lateral gradient of boron is more than 250 angstroms per decade. After the application of activation annealing, the gradient of the boron halo profile increases more due to transient enhanced diffusion. The lateral spread of the boron halo profile shown in FIG. 12 contributes to short channel effects, such as threshold voltage rolloff, as the gate length is reduced.

Figure 13:
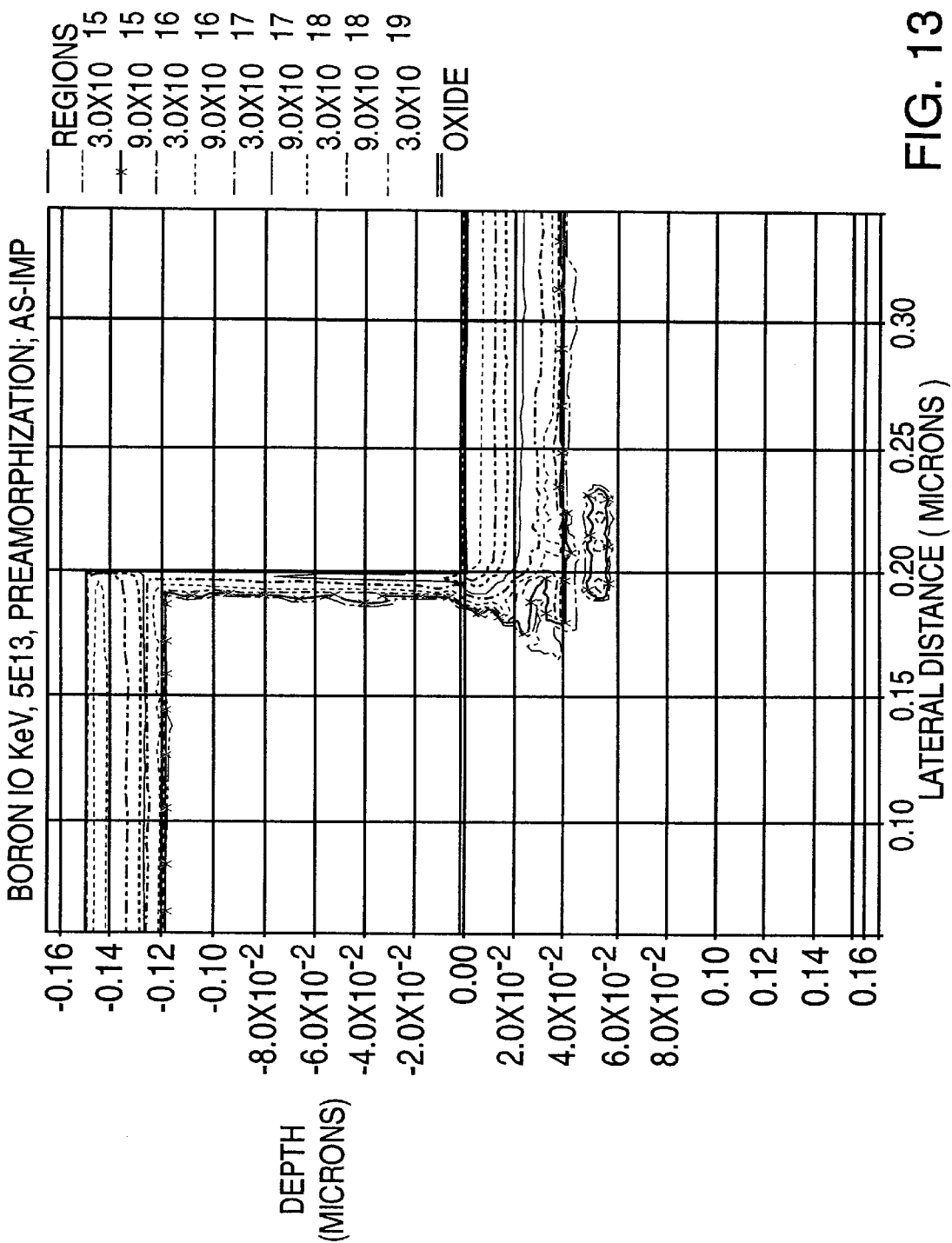
FIG. 13 is a plot illustrating lateral straggle of boron at an ion implantation energy of 1 keV.

The results of a second Monte Carlo simulation are shown in FIG. 13. FIG. 13 shows the results for a boron implantation in the silicon at an energy of 1 keV in a dose of 5E13 ions/cm$^2$. As shown in the plot of FIG. 13, the lateral gradient of boron is much sharper than that shown in FIG. 12. The implantation at 1 keV reduces the lateral gradient to less than about 100 angstroms per decade near the gate oxide interface.

Figure 14:
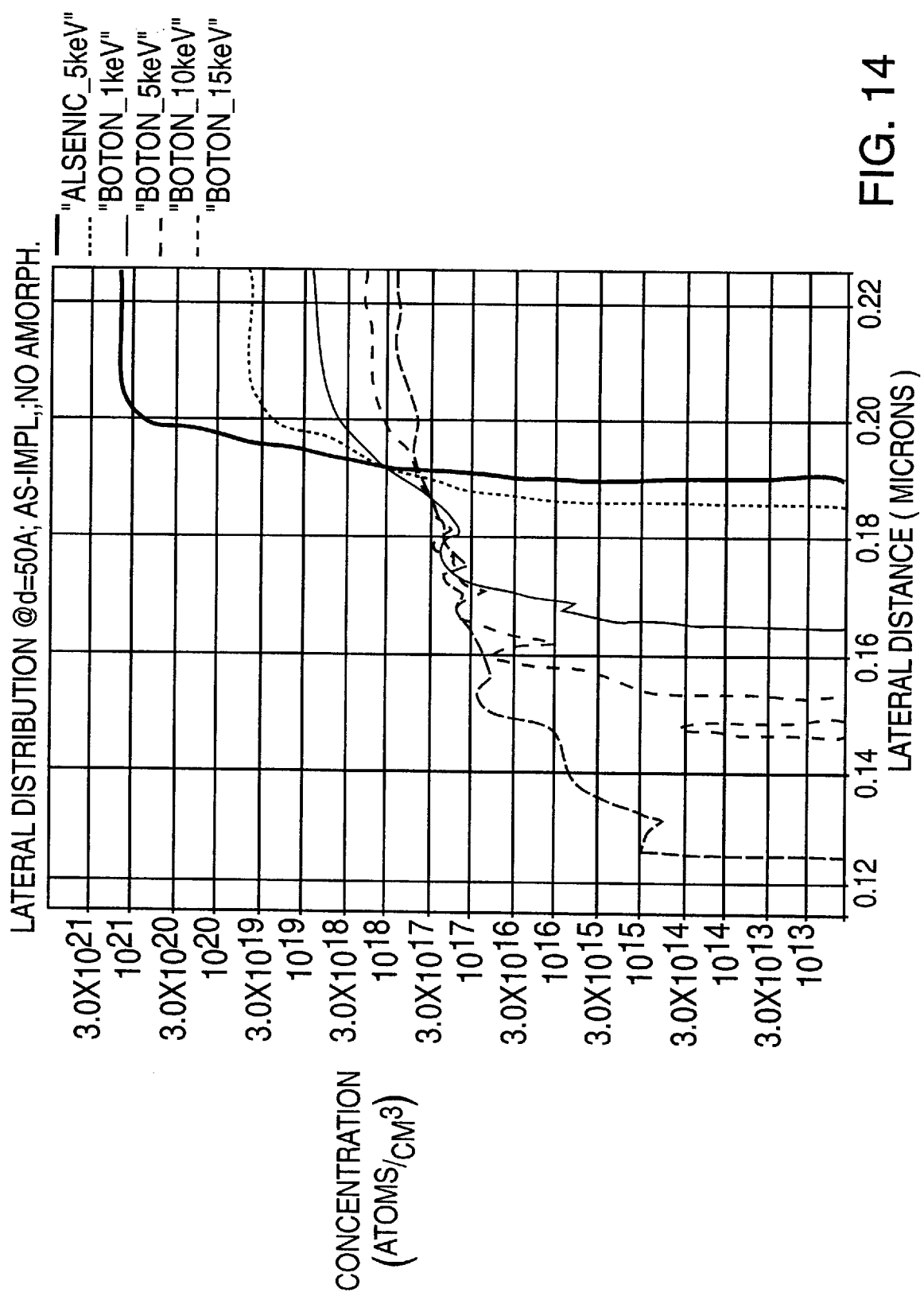
FIG. 14 is a plot of the lateral distribution of boron in a silicon substrate at various ion implantation energies and at a distance of 50 angstroms below the surface of the silicon substrate.

The lateral profile of the boron halo implant at a depth of 50 angstroms below the silicon surface is shown in FIG. 14. This profile indicates that the halo doping inside the channel region of an MOS device can be highly localized by the low-energy implant into a planar silicon surface. As illustrated in FIG. 14, when the boron implant energy is reduced from 15 to 1 keV, the lateral distribution 50 angstroms below the silicon surface becomes progressively smaller.

Figure 15:
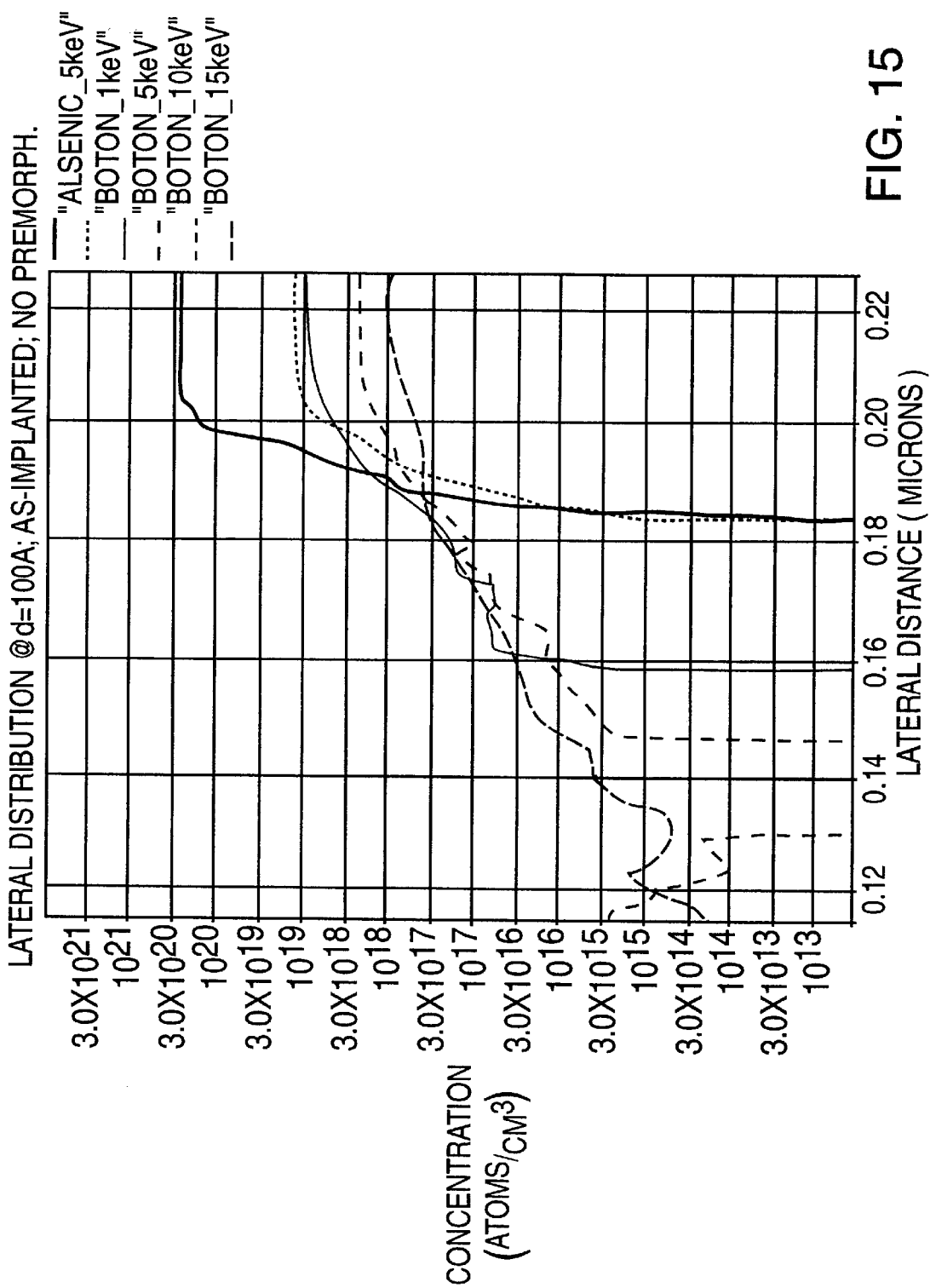
FIG. 15 is a plot of the lateral distribution of boron in a silicon substrate at various ion implantation energies and at a distance of 100 angstroms below the surface of the silicon substrate.

However, the lateral distribution of the low-energy implanted boron at progressively greater depths in the silicon substrate becomes limited. The boron halo effect with a single-step low-energy implant becomes inefficient at deeper regions in the substrate, where a higher halo concentration is required to prevent punch-through. For example, as illustrated in FIG. 15, the lateral distribution of boron tends to become independent of implant energy at deeper regions in the substrate, and the boron concentration is not high enough as compared to the arsenic in the extension region. The concentration imbalance is a problem since the off-state current increases significantly with such a low level of halo dopant concentration.

The problem of insufficient halo doping with low-energy implantation can be avoided by structural change. For the fabrication of precisely defined halo regions in an MOS device, it is necessary to form a recess in the source and drain regions to form a second surface, and to introduce the second halo implant using the recess and low energy implantation again, thereby forming highly a localized boron halo region with reduced lateral straggle. Accordingly, by utilizing the twostep halo implant process in accordance with the invention, the tendency for boron not to laterally spread at lower implant energies near the silicon surface can be effectively utilized.

Thus it is apparent that there has been disclosed in accordance with the invention a process for fabricating an MOS device having a highly-localized halo region that fully provides the advantages set forth above. Those skilled in the art will recognize that variations and modifications can be made without departing from the spirit and scope of the invention. For example, several methods can be used for implanting doping species into the substrate, such as plasma doping, and the like. Accordingly, all such variations and modifications are within the scope of the present invention as set forth in the appended claims and equivalents thereof.

What is claimed is:

1. A process for fabricating a semiconductor device comprising the steps of:
   providing a semiconductor substrate having a first surface and a gate electrode structure disposed on the first surface and separated therefrom by a gate dielectric layer;
   forming a first halo region at the first surface adjacent to the gate electrode structure;
   removing a portion of the first surface to form a second surface and to form a wall surface connecting the first surface and the second surface and substantially perpendicular to the first and second surfaces; and
   forming a second halo region at the second surface, wherein the first halo region is continuous with the second halo region.

2. The process of claim 1, wherein the steps of forming a first halo region and second halo region comprise boron ion implantation at an implantation energy of no more than about 1 keV.

3. The process of claim 1, wherein the step of forming a second halo region comprises implanting boron at an angle of incidence offset with respect to the normal of the second surface.

4. The process of claim 1 further comprising forming an extension region at the first surface, wherein the extension region is bounded by the first halo region.

5. The process of claim 4 further comprising forming a sidewall spacer adjacent to the gate electrode structure prior to removing a portion of the first surface, wherein the sidewall spacer overlies the extension region at the first surface.

6. The process of claim 1 further comprising selectively depositing a semiconductor material at the second surface to form source and drain regions on either side of the gate electrode structure.

7. The process of claim 6 further comprising: forming an insulating layer overlying the source and drain regions; removing the gate electrode structure leaving a pace bounded by the insulating layer; and forming a metal region in the space.

8. The process of claim 1, further comprising forming a sidewall spacer adjacent to the gate electrode structure prior to removing a portion of the first surface; doping the substrate to form source and drain regions in the substrate using the sidewall spacer as a doping mask; and removing the sidewall spacer prior to forming the first halo region.

9. The process of claim 1, wherein the step of providing a semiconductor substrate comprises providing a silicon-on-insulator substrate comprising a layer of semiconductor material overlying an electrically insulative region.

10. A process for fabricating a semiconductor device comprising the steps of:

provide a semiconductor substrate having first surface and a gate electrode structure disposed on the first surface;

forming a sidewall spacer overlying the first surface adjacent to the gate electrode structure;

forming a first halo region at the first surface adjacent to the sidewall spacer;

etching a portion of the first surface using the sidewall spacer as an etching mask to form a second surface, wherein the first surface is connected to the second surface by a substantially vertical sidewall; and forming a second halo region at the second surface, wherein the first halo region is continuous with the second halo region.

11. The process of claim 10, wherein the steps of forming a first and a second halo region comprise boron ion implantation at an implantation energy of no more than about 1 keV.

12. The process of claim 10 further comprising forming an extension region at the first surface prior to forming the sidewall spacer, wherein the extension region is bounded by the first halo region.

13. The process of claim 10 further comprising selectively forming a layer of semiconductor material overlying the second surface and doping the layer of semiconductor material.

14. The process of claim 13 further comprising: forming an insulating layer overlying the source and drain regions; removing the gate electrode structure leaving a space bounded by the insulating layer; and forming a metal region in the space.

15. The process of claim 10, further comprising forming a sidewall spacer adjacent to the gate electrode structure prior to removing a portion of the first surface; doping the substrate to form source and drain regions in the substrate using the sidewall spacer as a doping mask; and removing the sidewall spacer prior to forming the first halo region.

16. A process for fabricating a halo region in a semiconductor device comprising the steps of:

providing a semiconductor surface having a first surface;

implanting a dopant using a method selected from the group consisting of boron at an energy of no more than about 1 keV and an n-type dopant at an energy of no more than about 5 keV into the first surface to form a first portion of the halo region having a first junction depth with respect to the first surface;

etching the first surface to form a second surface;

implanting a dopant using a method selected from the group consisting of boron at an energy of no more than about 1 keV and an n-type dopant at an energy of no more than about 5 keV into the second surface to form a second portion of the halo region, wherein the second portion is continuous with the first portion, wherein the second halo region has a second junction depth with respect to the first surface, and wherein the second junction depth is greater than the first junction depth.

17. The process of claim 16, wherein the step of implanting a dopant to form a second portion of the halo region comprises ion implantation at an angle of incidence that is offset with respect to a normal of the second surface.

18. The process of claim 16, wherein the step of etching the first surface comprises etching a portion of the first surface, such that the first surface is connected to the second surface by a substantially vertical sidewall.

19. The process of claim 16 further comprising forming an extension region at the first surface, wherein the extension region is bounded by the first portion of the halo region.

* * * * *